(12) United States Patent
Moriya

(10) Patent No.: US 7,517,618 B2
(45) Date of Patent: Apr. 14, 2009

(54) MASK, EXPOSURE METHOD AND PRODUCTION METHOD OF SEMICONDUCTOR DEVICE

(75) Inventor: Shigeru Moriya, Kanagawa (JP)

(73) Assignee: Sony Corporation, Tokyo (JP)

( * ) Notice: Subject to any disclaimer, the term of this patent is extended or adjusted under 35 U.S.C. 154(b) by 790 days.

(21) Appl. No.: 11/047,449

(22) Filed: Jan. 31, 2005

(65) Prior Publication Data

US 2005/0170265 A1     Aug. 4, 2005

(30) Foreign Application Priority Data

Feb. 4, 2004     (JP)     ............................ P2004-028077

(51) Int. Cl.
*G03F 9/00*     (2006.01)
(52) U.S. Cl. .......................................... 430/5; 430/311
(58) Field of Classification Search ................ 430/311, 430/5; 716/21, 19
See application file for complete search history.

(56) References Cited

U.S. PATENT DOCUMENTS

| | | | | |
|---|---|---|---|---|
| 5,546,225 A | * | 8/1996 | Shiraishi ..................... | 359/559 |
| 2003/0137024 A1 | * | 7/2003 | Moriya et al. ............... | 257/435 |
| 2003/0228758 A1 | | 12/2003 | Moniwa et al. | |

FOREIGN PATENT DOCUMENTS

| JP | 2003-059819 | 2/2003 |
|---|---|---|
| JP | 2003-092250 | 3/2003 |

OTHER PUBLICATIONS

Japanese Office Action Issued on Feb. 6, 2007.
European Search Report dated Mar. 21, 2006.
Isao Ashida et al.; Data processing for LEEPL mask: splitting and placement correction; Proceedings of SPIE, vol. 4754, 2002.
S. Omori et al.; Complementary masking approach for proximity electron lithography; Journal of Vacuum Science & Technology; vol. 21, No. 1, Jan. 2003.

* cited by examiner

*Primary Examiner*—Mark F Huff
*Assistant Examiner*—Rashid Alam
(74) *Attorney, Agent, or Firm*—Sonnenschein Nath & Rosenthal LLP

(57) ABSTRACT

A mask capable of improving accuracy of transferring a pattern by making the configuration of a beam portion regular and simple, an exposure method using the mask and a production method of a semiconductor device; wherein the beam portion is composed of a first beam portion wherein a plurality of first beams extending by inclining with respect to the X axis and Y axis are arranged at regular intervals and a second beam portion wherein a plurality of second beams extending by inclining with respect to the X axis and Y axis and intersecting with the first beams are arranged at regular intervals, and the beam configuration is made regular on all region surrounded by a supporting frame; four unit exposure regions for performing exposure by being superimposed on an object to be exposed are set in the region surrounded by the supporting frame, and a membrane of at least two unit exposure regions exists at any position when superimposing the four unit exposure regions.

6 Claims, 19 Drawing Sheets

12  13

MASK, EXPOSURE METHOD AND PRODUCTION METHOD OF SEMICONDUCTOR DEVICE

BACKGROUND OF THE INVENTION

1. Field of the Invention

The present invention relates to a mask used for producing, for example, a semiconductor device, an exposure method and a production method of a semiconductor device.

2. Description of the Related Art

A proximity exposure technology of equal scale for performing exposure by placing a mask called a stencil mask, on which a mask pattern is formed by apertures, close to a wafer and irradiating a low accelerated electron beam to the mask has been disclosed (refer to The Japanese Patent No. 2951947). To realize the exposure technique, development of a stencil mask provided with a thin film (membrane) having a thickness of 500 nm to 1 μm or so and development of a resist process have been pursued recently.

Size of one membrane has to be small to maintain mechanical strength of the membrane formed with pattern apertures, and there has been a proposal of a mask structure wherein a membrane is sectionalized to small regions and reinforced by beams (refer to The Japanese Unexamined Patent Publication No. 2003-59819). In this case, pattern apertures cannot be formed on beam positions, so that a complementary dividing technique for transferring a desired circuit pattern by dividing the circuit pattern to be transferred to the wafer, forming the divided patterns on a plurality of membranes and superimposing the membranes to perform exposure is necessary.

The Japanese Unexamined Patent Publication No. 2003-59819 discloses a mask wherein a size of one membrane is made to be 1 to 3 mm or so by sectionalizing it by beams and an arrangement of the beams of each of four masks is shifted. By performing exposure by superimposing the four mask regions, a predetermined circuit pattern is transferred on a wafer. In the mask described in The Japanese Unexamined Patent Publication No. 2003-59819, a size of one mask region is approximately the same as a die (chip) size to be a unit region to be exposed on the wafer.

However, in the stencil mask described in The Japanese Unexamined Patent Publication No. 2003-59819, beams for reinforcing the membrane are complicatedly arranged to be shifted from each other on the four mask regions. Therefore, the beam structure is complicated, strain of the pattern to be formed on the membranes becomes complicated, and it becomes hard to correct the strain.

When the strain becomes hard to be corrected, it results in deterioration of pattern accuracy of a semiconductor device on which a pattern is formed by exposure using a stencil mask and a decline of reliability of the semiconductor device.

Also, in the stencil mask described in The Japanese Unexamined Patent Publication No. 2003-59819, a degree of freedom of an applicable die size on one beam arrangement is scarcely obtained, so that the beam arrangement has to be changed in accordance with a size of a die subjected to exposure. Therefore, a different mask blank has to be prepared for each device (semiconductor device) to be produced.

If a mask blank before pattern formation is applicable to dies with different sizes to a certain degree, one mask blank can be used for producing a plurality of devices, so that a cost reduction can be attained.

As explained above, in terms of correcting strain of a pattern, a stencil mask with a regular and simple beam structure is preferable. Also, in terms of a cost reduction, it is preferable that a range of an applicable die size in one stencil mask can be made wide.

SUMMARY OF THE INVENTION

An object of the present invention is to provide a mask capable of improving transfer accuracy of a pattern by making the beam structure regular and simple.

Another object of the present invention is to provide an exposure method capable of transferring a pattern with accuracy by performing exposure by using the above mask.

Still another object of the present invention is to provide a production method of a semiconductor device capable of producing a reliable semiconductor device by forming a pattern layer with accuracy by applying the exposure method using the above mask.

To attain the above objects, according to the present invention, there is provided a mask comprising a supporting frame, a beam portion for sectionalizing a region surrounded by the supporting frame, a thin film formed on the region sectionalized by the beam portion, and apertures of a pattern formed on the thin film and obtained by complementarily dividing a circuit pattern to be transferred on an object to be exposed; wherein the beam portion comprises a first beam portion wherein a plurality of beams extending by inclining with respect to two coordinate axes composing a coordinate system for specifying a position of the pattern are arranged at regular intervals, and a second beam portion wherein a plurality of beams extending by inclining with respect to the two coordinate axes and intersecting with the first beam portion are arranged at regular intervals; wherein four unit exposure regions for performing exposure by being superimposed on the object to be exposed are set in the region surrounded by the supporting frame, and the thin film of at least two of the unit exposure regions exists at any position when superimposing the four unit exposure regions.

In the mask of the present invention explained above, a beam portion is composed of a first beam portion wherein a plurality of beams extending by inclining with respect to two coordinate axes composing a coordinate system for specifying a position of the pattern are arranged at regular intervals, and a second beam portion wherein a plurality of beams extending by inclining with respect to the two coordinate axes and intersecting with the first beam portion are arranged at regular intervals, and the beam structure is made regular on all region surrounded by the supporting frame.

Also, four unit exposure regions for performing exposure by being superimposed on the object to be exposed are set in the region surrounded by the supporting frame, and the thin film of at least two of the unit exposure regions exists at any position when superimposing the four unit exposure regions.

Accordingly, a circuit pattern is transferred on the object to be exposed by forming complementarily divided patterns of a circuit pattern to be transferred to the object to be exposed, assigning them to thin films of at least two unit exposure regions and performing exposure by superimposing the four unit exposure regions.

To attain the above object, according to the present invention, there is provided an exposure method using a mask comprising a supporting frame, a beam portion for sectionalizing a region surrounded by the supporting frame, a thin film formed on the region sectionalized by the beam portion, and apertures of a pattern formed on the thin film and obtained by complementarily dividing a circuit pattern to be transferred on an object to be exposed; wherein the beam portion comprises a first beam portion wherein a plurality of beams extending by inclining with respect to two coordinate axes composing a coordinate system for specifying a position of the pattern are arranged at regular intervals, and a second beam portion wherein a plurality of beams extending by inclining with respect to the two coordinate axes and intersecting with the first beam portion are arranged at regular intervals; wherein four unit exposure regions for performing exposure by being superimposed on the object to be exposed are set in the region surrounded by the supporting frame, and the thin film of at least two of the unit exposure regions exists at any position when superimposing the four unit exposure regions; for performing exposure by repeating a charged particle beam irradiation step for irradiating a charged particle beam on the four unit exposure regions of the mask, and a moving step for moving relative positions of the mask and the object to be exposed, and superimposing the four unit exposure regions of the mask on the object to be exposed.

In the exposure method of the present invention explained above, the regular beam structure is formed in the region surrounded by the supporting frame, and a mask wherein four unit exposure regions for performing exposure by being superimposed on an object to be exposed are set in the region surrounded by the supporting frame is used.

The thin film of at least two of the unit exposure regions exists at any position when superimposing the four unit exposure regions. Therefore, each of the unit exposure regions is arranged with each of complementarily divided patterns of the circuit pattern to be transferred to the object to be exposed.

Exposure is performed by repeating a charged particle beam irradiation step for irradiating a charged particle beam on the four unit exposure regions of the mask, and a moving step for moving relative positions of the mask and the object to be exposed, and superimposing the four unit exposure regions of the mask on the object to be exposed. As a result, exposure is performed by superimposing the four unit exposure regions, and the circuit pattern is transferred to the object to be exposed.

To attain the above object, according to the present invention, there is provided a production method of a semiconductor device for forming layers of a pattern by repeating a step of forming a processing film on a substrate, a step of forming a photosensitive film on the processing film, a step of performing exposure of a pattern of a mask on the photosensitive film, and a step of performing pattern processing on the processing film by performing etching on the processing film by using as an etching mask the photosensitive film subjected to pattern exposure, using a mask comprising a supporting frame, a beam portion for sectionalizing a region surrounded by the supporting frame, a thin film formed on the region sectionalized by the beam portion, and apertures of a pattern formed on the thin film and obtained by complementarily dividing a circuit pattern to be transferred on an object to be exposed; wherein the beam portion comprises a first beam portion wherein a plurality of beams extending by inclining with respect to two coordinate axes composing a coordinate system for specifying a position of the pattern are arranged at regular intervals, and a second beam portion wherein a plurality of beams extending by inclining with respect to the two coordinate axes and intersecting with the first beam portion are arranged at regular intervals; wherein four unit exposure regions for performing exposure by being superimposed on the object to be exposed are set in the region surrounded by the supporting frame, and the thin film of at least two of the unit exposure regions exists at any position when superimposing the four unit exposure regions; wherein in a step of performing exposure of a pattern of the mask on the photosensitive film, exposure is performed by repeating a charged particle beam irradiation step for irradiating a charged particle beam on the four unit exposure regions of the mask, and a moving step for moving relative positions of the mask and the object to be exposed, and superimposing the four unit exposure regions of the mask on the object to be exposed.

In the production method of a semiconductor device of the present invention explained above, in the step of performing exposure of a pattern of a mask on a photosensitive film, a mask wherein the regular beam structure is formed in the region surrounded by the supporting frame, and the four unit exposure regions for performing exposure by being superimposed on the photosensitive film are set in the region surrounded by the supporting frame is used.

The thin film of at least two of the unit exposure regions exists at any position when superimposing the four unit exposure regions. Therefore, each of the unit exposure regions is arranged with each of complementarily divided patterns of the circuit pattern to be transferred to the photosensitive film.

In the above exposure step, the exposure is performed by repeating a charged particle beam irradiation step for irradiating a charged particle beam on the four unit exposure regions of the mask, and a moving step for moving relative positions of the mask and the object to be exposed, and superimposing the four unit exposure regions of the mask on the photosensitive film. As a result, exposure is performed by superimposing the four unit exposure regions and the circuit pattern is transferred to the photosensitive film.

Then, pattern processing is performed on the processing film by performing etching on the processing film by using as an etching mask the photosensitive film subjected to pattern exposure, so that a layer of the pattern is formed.

According to the mask of the present invention, the beam structure can be made regular and simple and, thereby, transfer accuracy of a pattern can be improved.

According to an exposure method of the present invention, a pattern can be transferred with accuracy by performing exposure by using the above mask.

According to a production method of a semiconductor device of the present invention, by forming a pattern layer with accuracy by applying the exposure method using the above mask, a reliable semiconductor device can be produced.

BRIEF DESCRIPTION OF DRAWINGS

These and other objects and features of the present invention will become clearer from the following description of the preferred embodiments given with reference to the attached drawings, in which.

DESCRIPTION OF THE PREFERRED EMBODIMENT

Below, embodiments of the present invention will be explained with reference to the drawings.

First Embodiment

Figure 1:
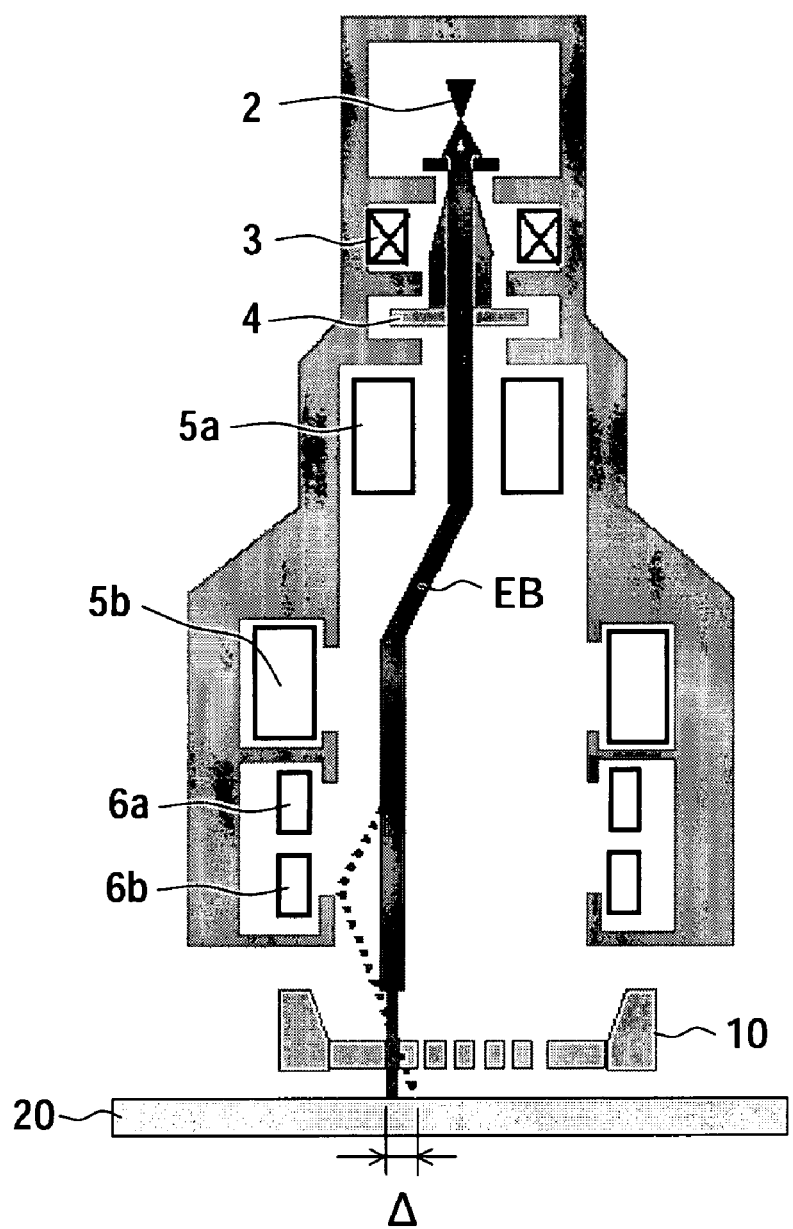
FIG. 1 is a view of an example of the configuration of an exposure apparatus for performing exposure by using a mask according to the present embodiment.

FIG. 1 is a view of an example of the configuration of an exposure apparatus for performing exposure by using a mask according to the present embodiment. The exposure apparatus shown in FIG. 1 is an exposure apparatus to be applied to an LEEPL technique.

The exposure apparatus shown in FIG. 1 comprises an electron gun 2, a condenser lens 3, an aperture 4, a pair of main deflectors 5a and 5b, and a pair of sub deflectors 6a and 6b.

The electron gun 2 emits an electron beam EB at an acceleration voltage of 2 kV or so. The electron beam EB emitted from the electron gun 2 passes through the condenser lens 3 and converges to be a parallel beam. The unnecessary portion of the electron beam EB converged to a parallel beam is blocked by the aperture 4.

The electron beam EB is swinged (is deflected) toward a target to be irradiated with the electron beam EB by the main deflector 5a, then, is swinged back (is returned) in a direction being parallel with an optical axis by being deflected by the main deflector 5b. Consequently, the electron beam EB irradiates the mask 10 approximately vertically. The main deflectors 5a and 5b scan the electron beam EB.

The sub deflectors 6a and 6b control an incident angle of the electron beam EB to the mask 10 to correct a position of a pattern to be transferred to a processing substrate 20, such as a wafer, to be exposed. By slightly inclining the electron beam EB, a pattern of the mask 10 displaced from the correct position is corrected to be a correct position on the processing substrate 20 and transferred. As shown in FIG. 1, by controlling the irradiation angle, an irradiation position of the electron beam EB to the processing substrate 20 can be moved exactly by Δ.

In FIG. 1, a not shown resist on the processing substrate 20 is exposed by the electron beam EB passed through the aperture pattern formed on a membrane of the mask 10 in FIG. 1. In the exposure apparatus shown in FIG. 1, an equal scale exposure is applied, and the mask 10 and the processing substrate 20 are arranged to be close to each other.

Figure 2:
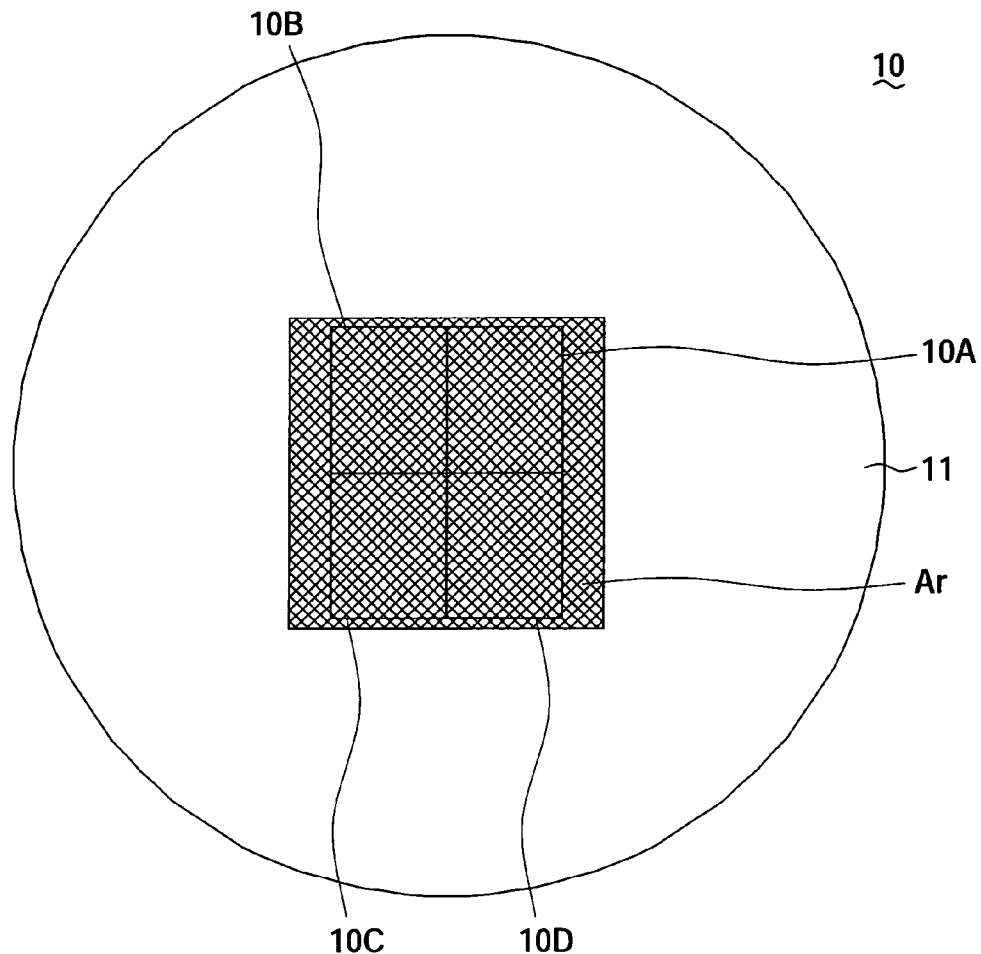
FIG. 2 is a plan view showing an example of the configuration of a mask.
Figure 3:
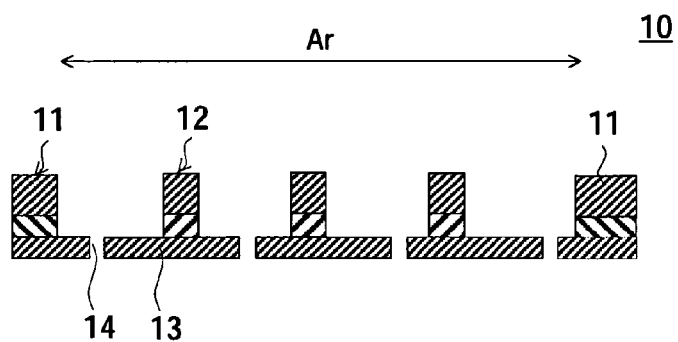
FIG. 3 is a schematic sectional view of the mask shown in FIG. 2.

FIG. 2 is a plan view of an example of the configuration of the mask 10, and FIG. 3 is a schematic sectional view of the mask shown in FIG. 2.

As shown in FIG. 2 and FIG. 3, the mask 10 comprises a supporting frame 11 being a thick film, beams 12 being thick films for sectionalizing a region Ar surrounded by the supporting frame 11, and membranes (thin films) 13 formed on the regions sectionalized by the beams 12. The membranes 13 function as electron beam blocking films and is formed a pattern 14 made by apertures. The pattern is obtained by complementarily dividing a circuit pattern to be transferred to the processing substrate 20.

Figure 4:
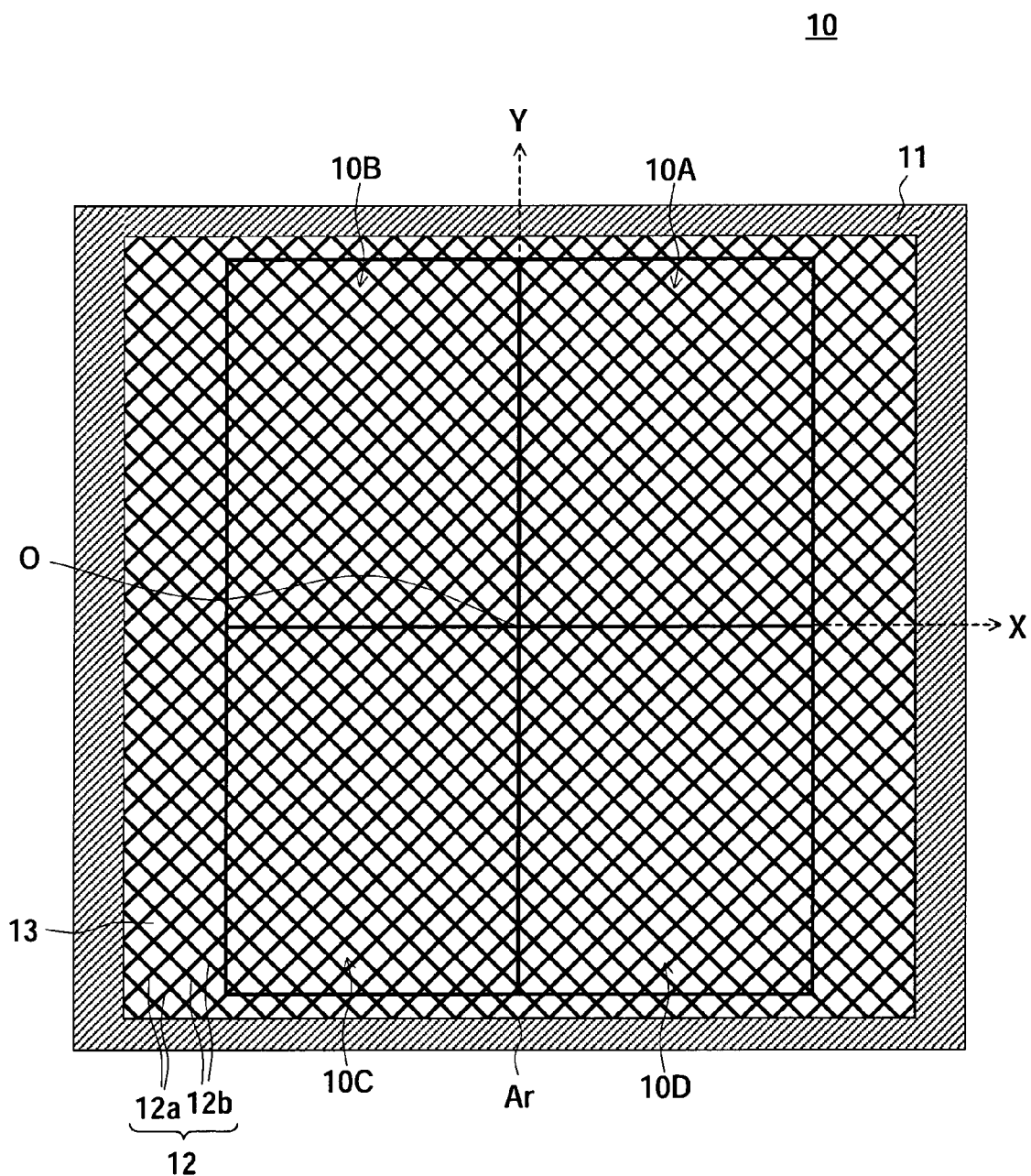
FIG. 4 is a view of the detailed configuration of beams.

FIG. 4 is a view of the detailed configuration of the beams 12.

The beams 12 are roughly divided to two in accordance with the extending directions, and composed of the first beams 12a and second beams 12b. Note that they are simply referred to as beams 12 when it is not necessary to discriminate the first beams 12a and the second beams 12b in explanations below. All of the plurality of beams 12 correspond to a beam portion of the present invention.

The first beams 12a extend by inclining with respect to the X-axis and Y-axis composing the XY coordinate system for specifying a position of the pattern. The plurality of first beans 12a are arranged at regular intervals. In the present embodiment, the first beams 12a extend by inclining by 45° with respect to the X-axis. All of the plurality of first beams 12a correspond to a first beam portion of the present invention.

The second beams 12b extend by inclining with respect to the X-axis and Y-axis and intersect with the first beams 12a. The plurality of second beams 12b are arranged at regular intervals. In the present embodiment, the second beams 12b extend by inclining, for example, by −45° with respect to the X-axis and intersect with the first beams 12a. All of the second beams 12b correspond to a second beam portion of the present invention.

The XY-coordinate system for specifying a position of the pattern is set, for example, along two sides of a rectangular die. The XY-coordinate system becomes reference coordinate for X-direction controlling and Y-direction controlling in stage controlling of the exposure apparatus. It is also used for electron beam scanning in the same way, wherein an electron beam scans along the X-axis direction (horizontal scanning) composing the XY-coordinate system, and the horizontal scanning is successively performed toward the Y-axis direction. In this way, the reference XY-coordinate system is set to be in common with all of pattern position specifying, stage controlling and electron beam scanning.

As explained above, the region Ar surrounded by the supporting frame 11 is sectionalized to a plurality of small regions by the beams 12, and the membranes 13 are formed on the sectionalized regions. The membranes 13 are regions where a pattern can be arranged.

As shown in FIG. 4, four unit exposure regions 10A, 10B, 10C and 10D for performing exposure by being superimposed on the processing substrate 20 are set in the region Ar surrounded by the supporting frame 11. The unit exposure regions 10A to 10D are set to be corresponding to the first quadrant to the fourth quadrant by using an approximate center portion of the region Ar surrounded by the supporting frame 11 as an origin "O".

Namely, the unit exposure region 10B is adjacent to the unit exposure region 10A in the X-axis direction, and the unit exposure region 10D is adjacent to the unit exposure region 10A in the Y-axis direction. Also, the unit exposure region 10C is adjacent to the unit exposure region 10B in the Y-axis direction and adjacent to the unit exposure region 10D in the X-axis direction. The unit exposure regions 10A to 10D share the origin "O".

The unit exposure regions 10A to 10D are the same size being same as a die size. Normally, in a photolithography for performing reduction projection by using an optical mask, one or a plurality of LSI chip patterns are mounted on the optical mask. In the present specification, one or a plurality of chips mounted on the optical mask are called dies. Sizes of the dies differ in accordance with sizes of chips to be mounted, and the maximum size is determined by performance of an optical exposure apparatus called a stepper or a scanner. When applying mix and match exposure of optical exposure and electron beam exposure, the unit exposure regions have to be set in accordance with sizes of the dies of the optical exposure.

As shown in FIG. 4, the region Ar surrounded by the supporting frame 11 is sectionalized by a plurality of beams 12 extending in the ±45° directions, and the beam structure is regular in the region Ar surrounded by the supporting frame 11. In the present embodiment, all of the membranes 13 sectionalized by the beams 12 have the same square shape.

The above four unit exposure regions 10A to 10D are superimposed on the processing substrate 20 and subjected to exposure. Since a pattern cannot be transferred on the beam 12 existing portions, it is necessary that a portion where the pattern cannot be transferred due to existence of beams 12 on one unit exposure region is complemented by forming the pattern on the membrane 13 on other unit exposure region. Furthermore, to respond to complementary dividing, there has to be a membrane 13 of at least two unit exposure regions at any position when superimposing the four unit exposure regions 10A to 10D.

In the exposure method using the mask according to the above present embodiment, all of the four unit exposure regions 10A to 10D are scanned by the electron beam EB. After scanning by the electron beam, relative positions of the mask 10 and the processing substrate 20 are changed exactly by a size of one unit exposure region, then, all of the four unit exposure regions 10A to 10D are scanned again by the electron beams EB. By repeating the electron beam irradiation step for irradiating the electron beam EB to the four unit exposure regions 10A to 10D of the mask 10 and the moving step for changing the relative positions of the mask 10 and the processing substrate 20 in this way (step-and-repeat exposure), the four unit exposure regions 10A to 10D of the mask 10 are superimposed on the processing substrate 20 to perform exposure (complementary exposure).

Figure 5:
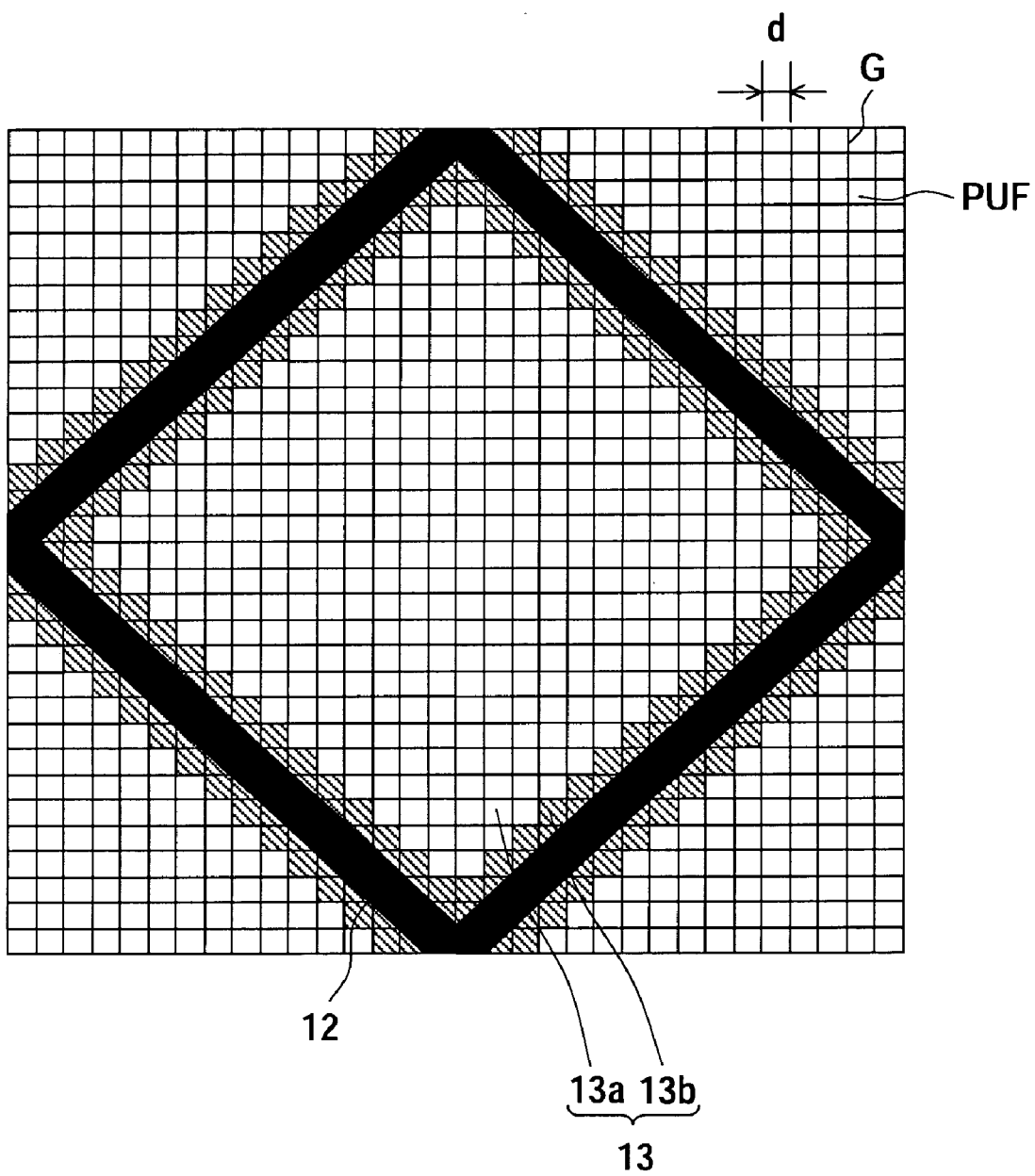
FIG. 5 is a view for explaining complementary dividing processing for arranging a pattern on the mask according to the present embodiment.

FIG. 5 is a view for explaining complementary dividing processing for arranging a pattern on the mask according to the present embodiment. FIG. 5 shows one membrane 13 sectionalized by beams 12 and illustrates with virtual grid lines G.

The region of the membranes 13 surrounded by the thick film beams 12 are divided to pattern arrangement regions 13a and margin regions 13b when used. A pattern is formed basically on the pattern arrangement regions 13a, but is also formed by running over a part of the margin regions 13b in some cases.

As shown in FIG. 5, for each of still smaller regions surrounded by the grid lines G, complementary dividing of a pattern and arrangement processing are performed. The regions are referred to as pattern processing unit regions PUF. The grid lines G are set at intervals of several μm to tens of μm and, for example, set at intervals of 10 μm. When setting the grid lines G at 10 μm intervals, the pattern processing unit regions PUF become to be a size of 10 μm×10 μm. For example, the pattern arrangement regions 13a of a membrane 13 is a shape of an approximate square of 1 to 5 mm or so, and a width of the beams 12 including the margins 13b is 100 to 500 μm or so. Note that in FIG. 5, for simplification of the illustration, intervals of the grid lines G are illustrated wider comparing with the width of the beams 12 and the size of the membrane 13.

When the pattern is not fit in the pattern arrangement regions 13a, a pattern on the running over portion is basically formed on other unit exposure region of the mask, and the patterns are put together by superposition exposure (complementary exposure).

However, in the case where the pattern slightly runs over from the pattern arrangement regions 13a, it is advantageous to transfer without dividing the pattern than to form a complementary pattern on any of other unit exposure regions and put them together. Particularly, in the case where a fine pattern with a narrow line width, for example, in the case where a gate slightly runs over from the pattern arrangement regions 13a, there is a possibility that characteristics of a semiconductor device to be produced decline when being divided to complementary patterns. Thus, margin regions 13b on which a pattern can be formed are provided around the pattern arrangement regions 13a.

Figure 6:
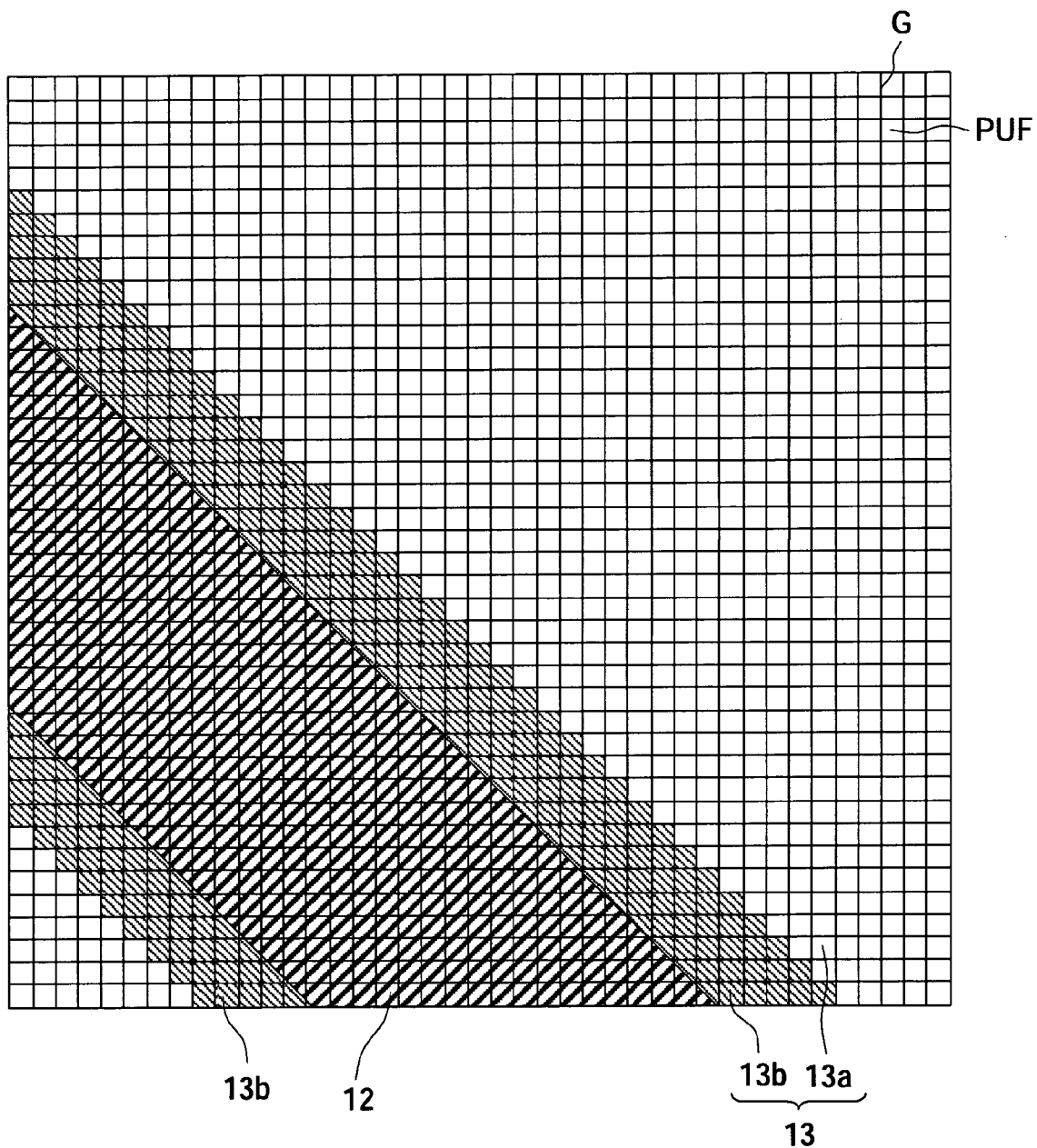
FIG. 6 is a view of relationship of sizes of an actual beam, a margin region and a pattern arrangement region, wherein a part around the beam is enlarged.

FIG. 6 shows relationship of sizes of an actual beam 12, margin regions 13b and pattern arrangement regions 13a of a membrane 13 when assuming that a pattern processing unit region PUF is 10 μm square.

As shown in FIG. 6, it is known that margin regions 13b of a sufficient size are secured, so that a pattern running over from the pattern arrangement regions 13a of the membrane 13 can be arranged on the margin regions 13b. By considering that the beams 12 include the margin regions 13b and confirming that the pattern arrangement regions 13a of the membrane 13 exist at least on two unit exposure regions at any position, it is possible to be applied to complementary exposure.

Next, possibility of applying the above mask according to the present embodiment to complementary exposure will be explained.

In the present example, by assuming that a width of the beams 12 including the margin regions 13b is 200 μm, pattern arrangement regions 13a of the membrane 13 is 1.8 mm square, and a pattern processing unit region PUF is 10 μm square, possibility of applying complementary exposure to a die having a size of 26×33 mm will be discussed.

Figure 7:
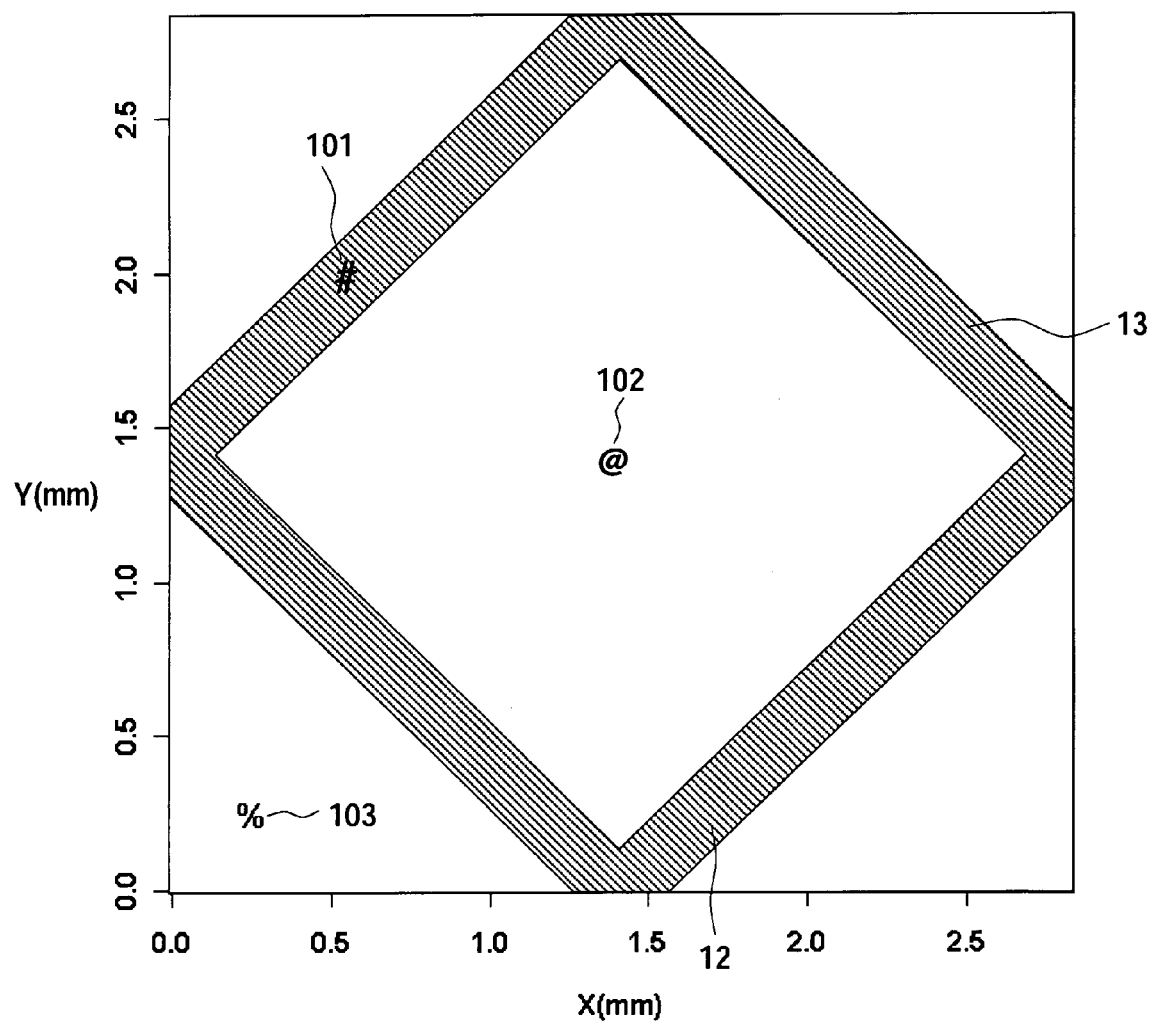
FIG. 7 is a view of a partial beam arrangement of a unit exposure region 10A.
Figure 8:
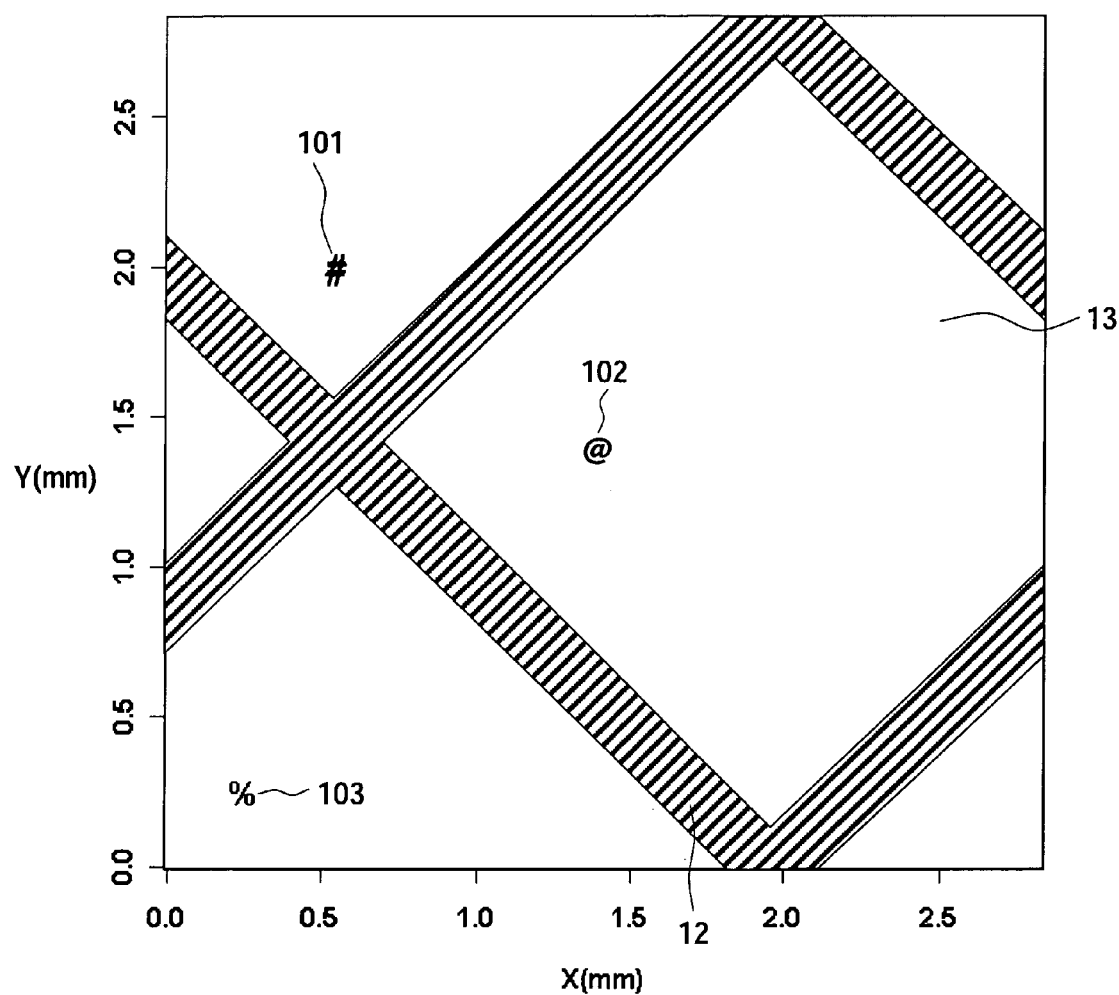
FIG. 8 is a view of a partial beam arrangement of a unit exposure region 10B.
Figure 9:
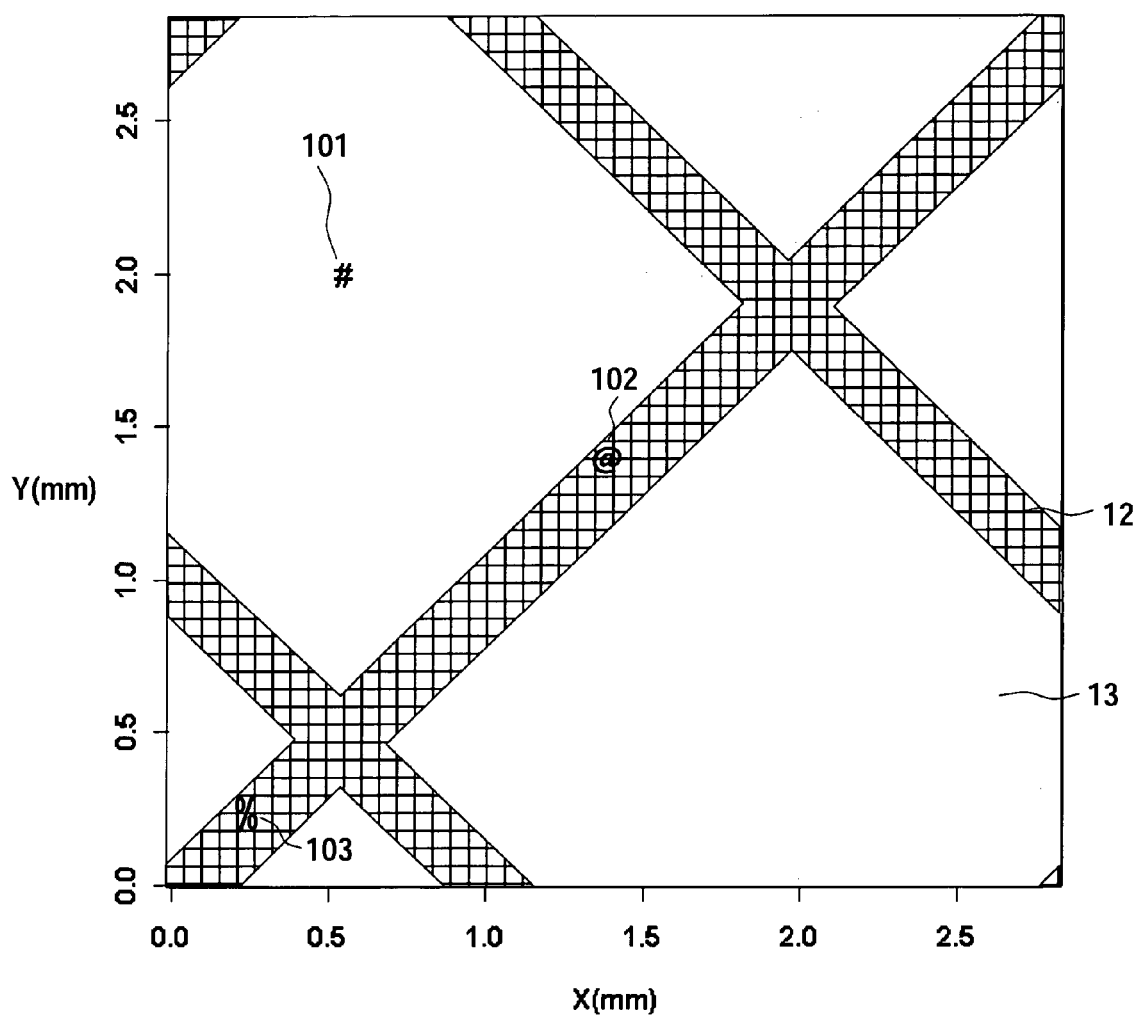
FIG. 9 is a view of a partial beam arrangement of a unit exposure region 10C.
Figure 10:
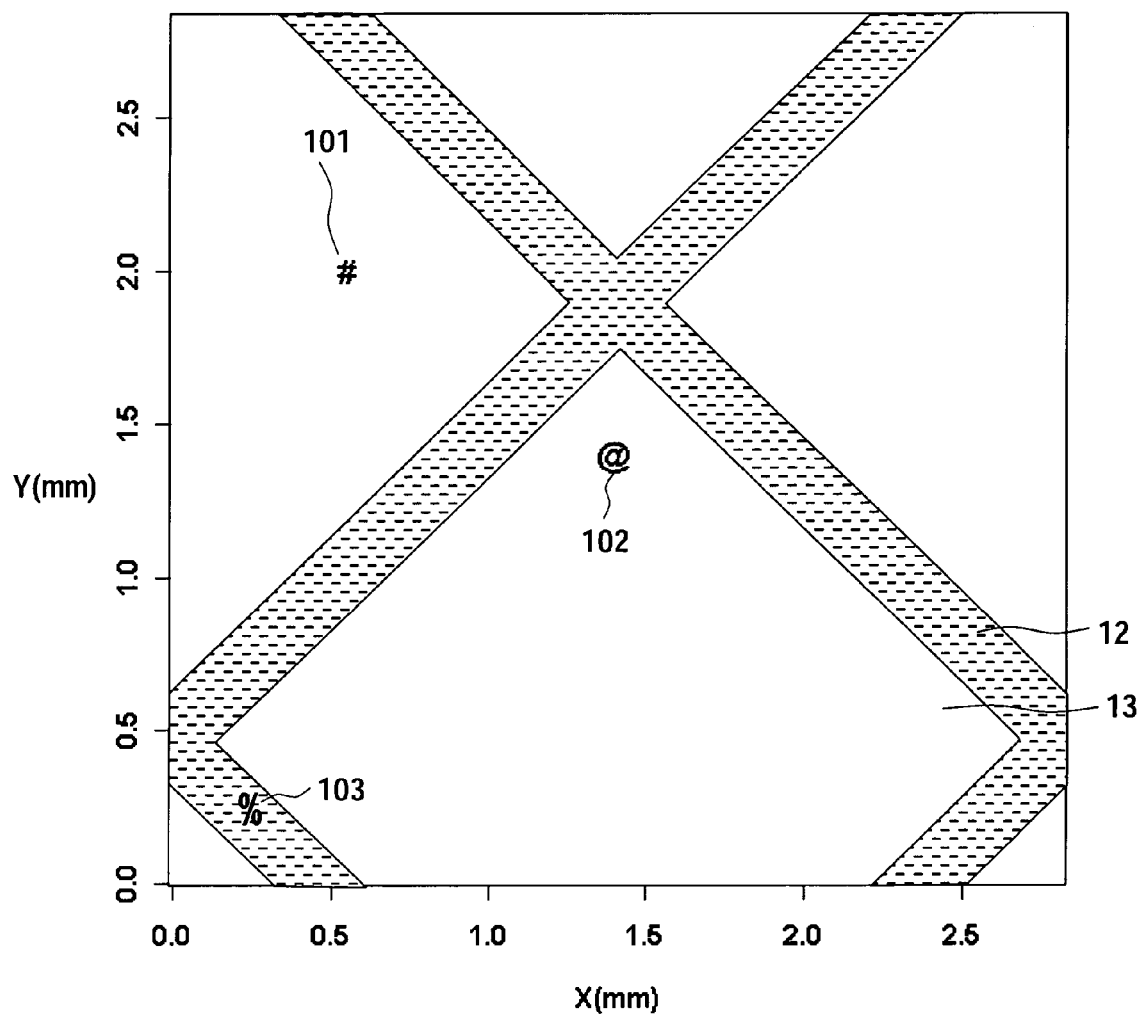
FIG. 10 is a view of a partial beam arrangement of a unit exposure region 10D.

FIG. 7 to FIG. 10 are views extracting a beam arrangement of a lower left portion of the respective unit exposure regions 10A to 10D in the case where the respective unit exposure regions 10A to 10D are set to be the same size as that of the above die size. FIG. 7 is a view of a beam arrangement of the unit exposure region 10A, FIG. 8 is a view of a beam arrangement of the unit exposure region 10B, FIG. 9 is a view of a beam arrangement of the unit exposure region 10C, and FIG. 10 is a view of a beam arrangement of the unit exposure region 10D.

In FIG. 7 to FIG. 10, to explain the possibility of applying complementary exposure, marks being different from one another are illustrated at pattern positions 101 to 103.

When referring to the marks illustrated in FIG. 7 to FIG. 10, the pattern position 101 positions on a beam in the unit exposure region 10A but positions on the membrane 13 in the unit exposure regions 10B to 10D. In the same way, the pattern position 102 positions on a beam in the unit exposure region 10C but positions on the membrane 13 in the unit exposure regions 10A, 10B and 10D. Furthermore, the pattern position 103 positions on a beam in the unit exposure regions 10C and 10D but positions on the membrane 13 in the unit exposure regions 10A and 10B. As is known from the above, all of the three pattern positions 101 to 103 exist on the membrane 13 on at least two of the four unit exposure regions 10A to 10D.

Figure 11:
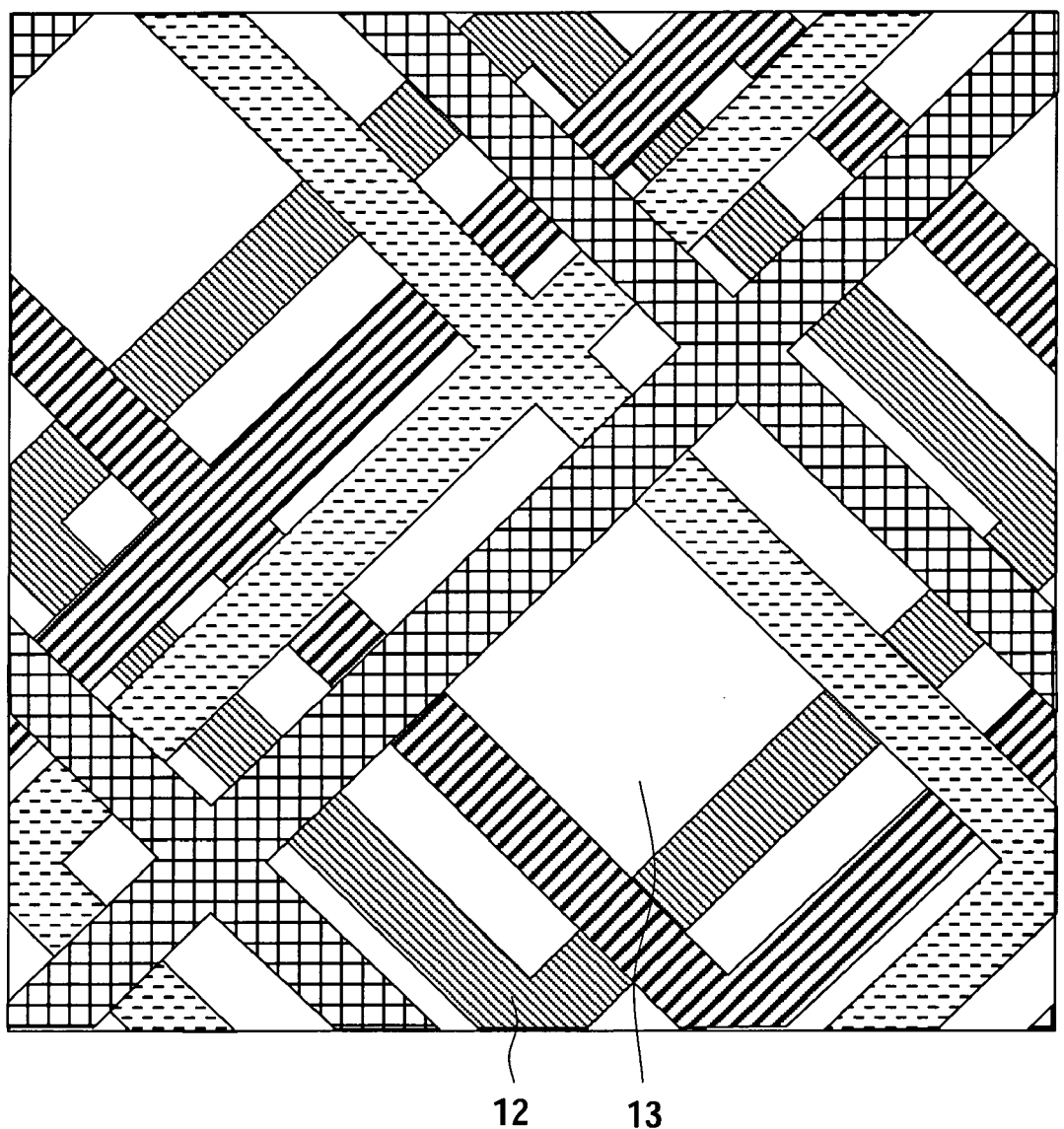
FIG. 11 is a view wherein all beam arrangements shown in FIG. 7 to FIG. 10 are superimposed.

FIG. 11 is a view wherein all of the beam arrangements shown in FIG. 7 to FIG. 10 are superimposed. In FIG. 11, each beam existing in each of the unit exposure regions 10A to 10D is illustrated with different hatching.

As shown in FIG. 11, beams 12 are not superimposed on three or more unit exposure regions at any position. Namely, at any position, the membrane 13 exists on at least two unit exposure regions.

From the above explanation, the mask according to the present embodiment can be applied to complementary exposure on a die with the above size. Note that since the beams 12 are arranged regularly, the above explanation on a part of the beam arrangement can also cover other parts, so that complementary exposure is possible on other parts.

Figure 12:
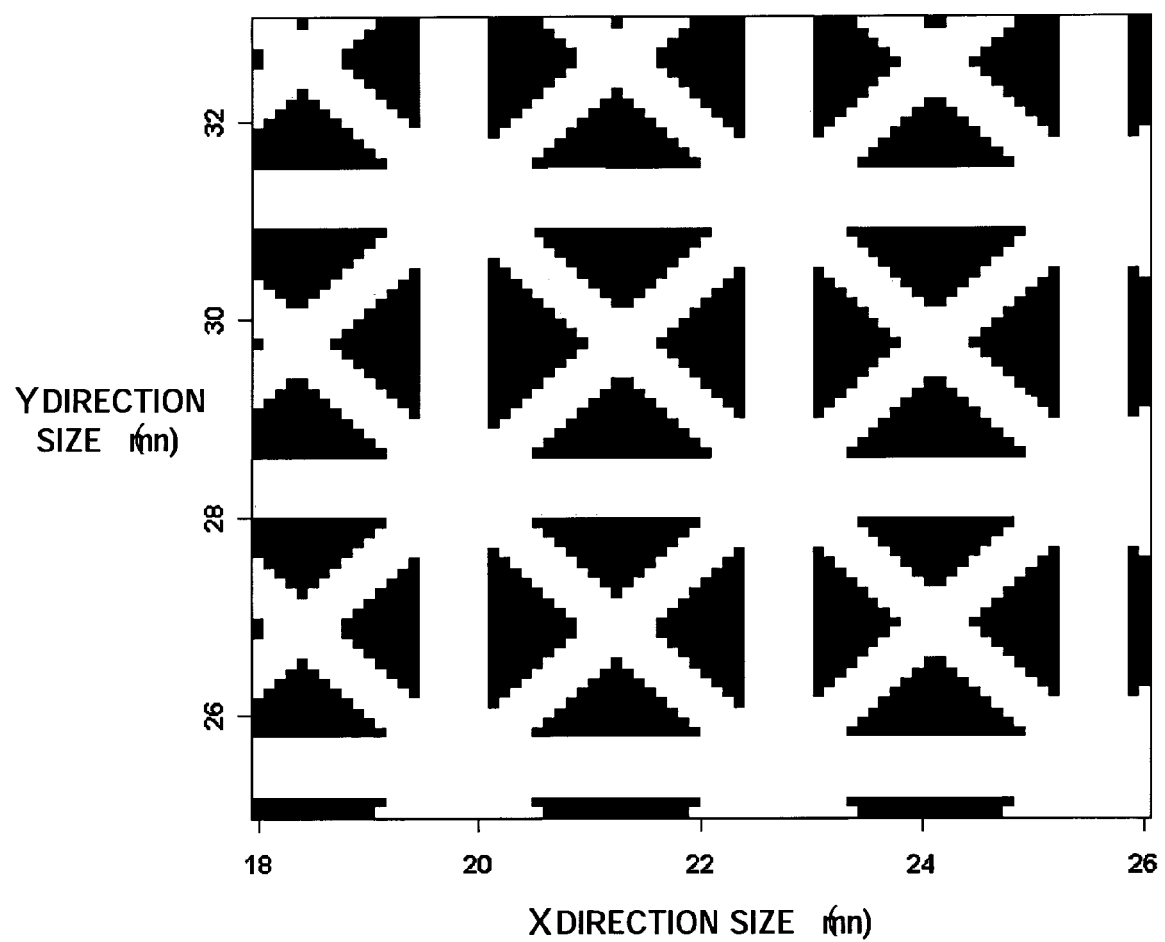
FIG. 12 is a view showing applicable die sizes to complementary exposure by a mask according to a first embodiment.

FIG. 12 is a view showing die sizes being applicable to complementary exposure by a mask produced on an assumption that a width of a beam 12 including margin regions 13b is 200 μm and a pattern arrangement region 13a of the membrane 13 is 1.8 mm square.

In FIG. 12, the abscissa axis indicates a size of the die in the X-direction and the ordinate axis indicates a size of the die in the Y-direction. FIG. 12 shows that die sizes in the black region can be applied to complementary exposure. For example, dies having a size of 24 (X-direction size)×26 (Y-direction size) and 24×28 are applicable to complementary exposure by the above mask. Also, complementary exposure by the above mask cannot be performed on a die having a size of 24×27. From FIG. 12, it is known that one kind of mask cannot cover any die size.

Figure 13:
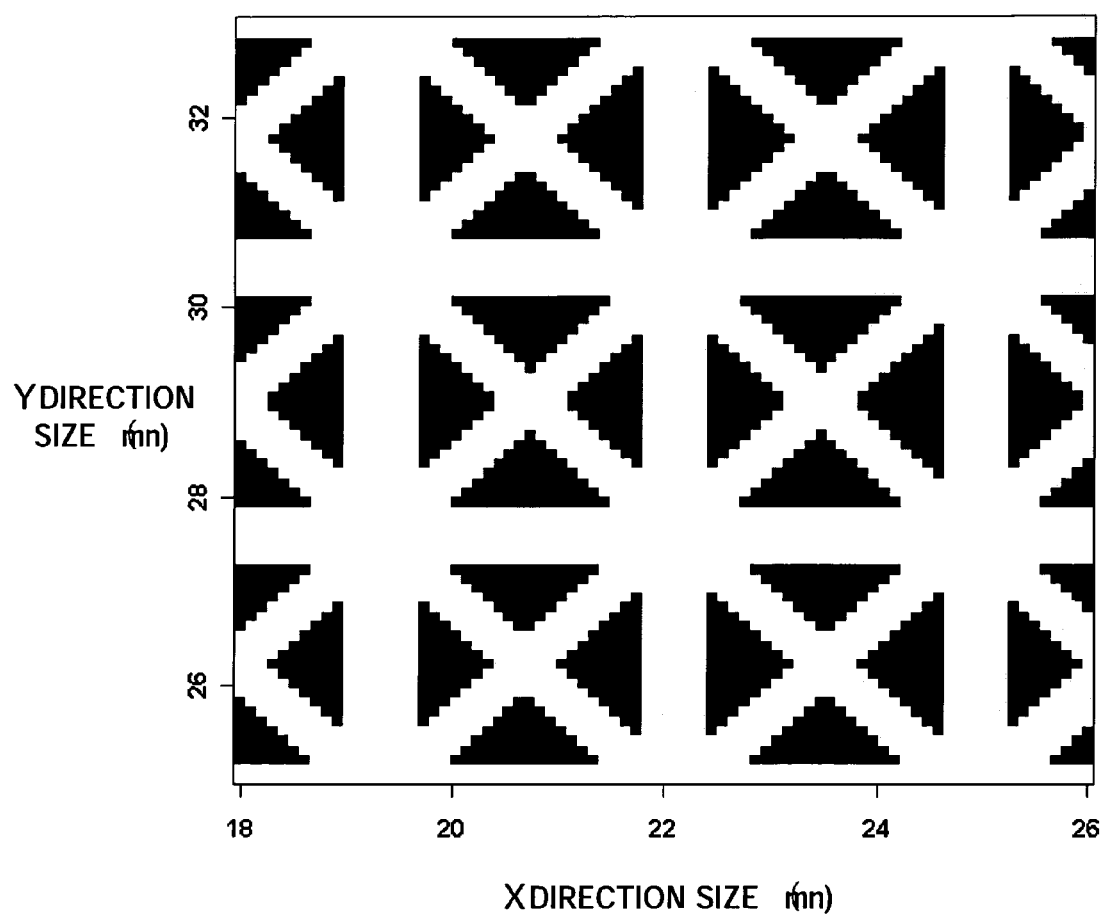
FIG. 13 is a view showing applicable die sizes to complementary exposure by a mask according to the first embodiment when a size of a pattern arrangement region on a membrane is changed.

FIG. 13 is a view showing die sizes applicable to complementary exposure by a mask produced to be the same size except that the pattern arrangement region 13a of the membrane 13 is 1.75 mm square.

Also, FIG. 13 shows that die sizes in the black region can be applied to complementary exposure by the above mask. As shown in FIG. 13, it is known that complementary exposure by the above mask becomes possible on a die having a size of, for example, 24×27 which was not applicable by the previous mask.

As explained above, one kind of mask cannot be applied to all die sizes, but an applicable die size can be changed by slightly changing a size of the pattern arrangement region 13a.

Next, an example of a production method of the above mask will be explained with reference to FIG. 14 to FIG. 16. Here, an example of producing a mask by using a SOI substrate will be explained.

Figure 14A:
FIG. 14 is a sectional view of a step of an example of a production method of a mask according to the present embodiment.

As shown in FIG. 14A, a SOI substrate obtained by forming a silicon oxide film 16 on a silicon substrate 15 and forming a thin film silicon layer 17 on the silicon oxide film 16 is prepared.

Figure 14B:
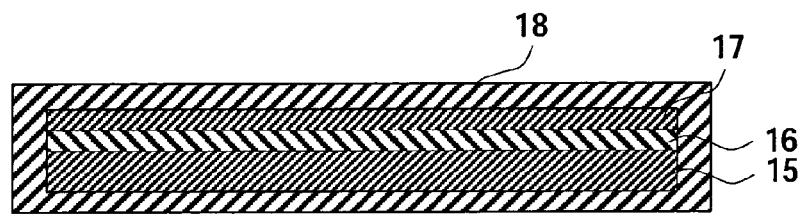

As shown in FIG. 14B, the whole surfaces including a front surface and back surface of the SOI substrate are formed with a silicon nitride film, for example, by a low pressure chemical vapor deposition (LPCVD) method to form a hard mask 18. A film thickness of the hard mask 18 is, for example, 400 nm or so.

Figure 14C:
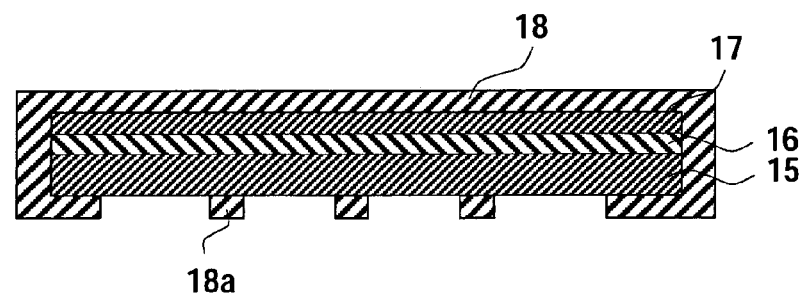

Next, as shown in FIG. 14C, by applying a resist and performing exposure and development on the hard mask 18 on the silicon substrate 15 side of the SOI substrate, and performing dry etching on the hard mask 18 by using the resist as an etching mask, a hard mask 18a having a pattern of a supporting frame 11 and beams 12 is formed. When etching the hard mask 18, for example, a fluorocarbon based gas is used. Then, the resist is removed.

Figure 15A:
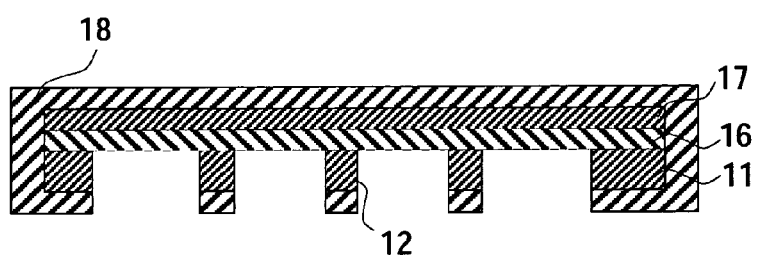
FIG. 15 is a sectional view of a step of an example of a production method of a mask according to the present embodiment.

Next, as shown in FIG. 15A, the hard mask 18a is used as an etching mask to perform etching on the silicon substrate 15 until reaching to the silicon oxide film 16 so as to form a supporting frame 11 and beams 12. When etching the silicon substrate 15, for example, a chlorine based gas is used.

Figure 15B:
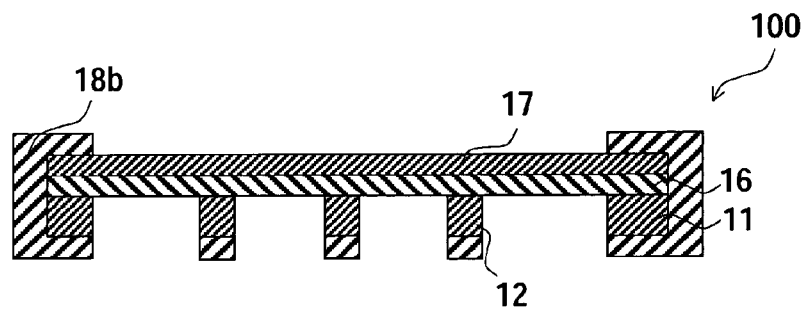

Next, as shown in FIG. 15B, a resist is applied and exposure and development are performed on the hard mask on the silicon layer 17 side of the SOI substrate, and the resist is used as an etching mask to perform dry etching the hard mask 18, so that a hard mask 18b is processed to be a pattern for exposing a region Ar surrounded by the supporting frame 11 (refer to FIG. 2). When etching the hard mask 18, for example, a fluorocarbon based gas is used. After that, the resist is removed.

In the present embodiment, those produced by the above procedure are used as mask blanks 100. Note that those produced by other procedure than the above may be also used as mask blanks.

Figure 16A:
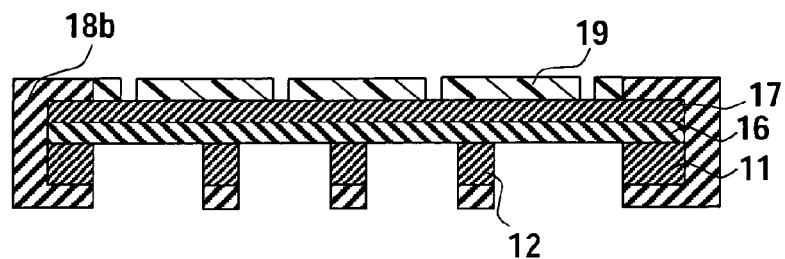
FIG. 16 is a sectional view of a step of an example of a production method of a mask according to the present embodiment.

Next, as shown in FIG. 16A, by forming an electron beam resist on the silicon layer 17 of the mask blanks 100, and drawing on the electron beam resist by using a mask drawing machine and developing, a resist pattern 19 having a pattern to be formed on a mask is formed.

Figure 16B:
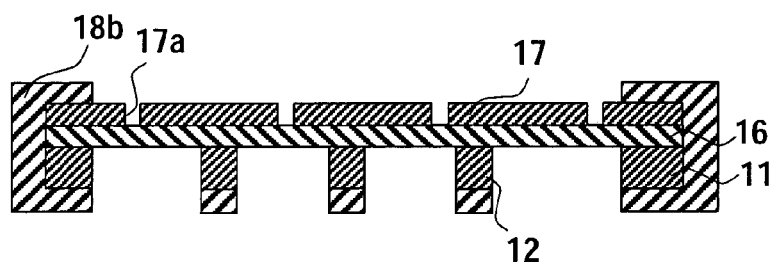

Next, as shown in FIG. 16B, the resist pattern 19 is used as an etching mask to perform dry etching the silicon layer 17, so that apertures 17a of the pattern are formed on the silicon layer 17. When etching the silicon layer 17, for example, chlorine based gas is used. After that, the resist pattern 19 is removed. In this step, the silicon oxide film 16 becomes an etching stopper and formed with apertures 17a reaching to the silicon oxide film 16.

Figure 16C:
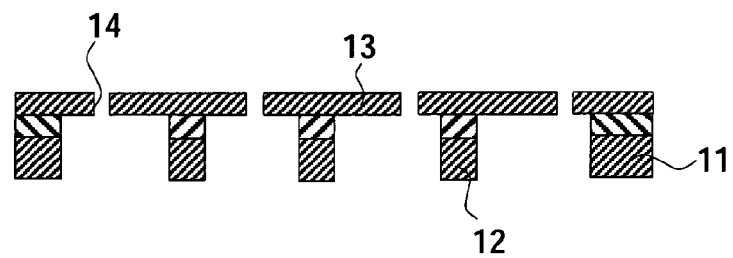

Finally, as shown in FIG. 16C, the silicon oxide film 16 being out of the beams 12 is removed by etching, furthermore, the hard mask 18 is removed, so that a mask formed with a pattern 14 made by apertures (through holes) is completed.

The mask according to the present embodiment can be preferably used in an exposure step in producing a semiconductor device.

Figure 17A:
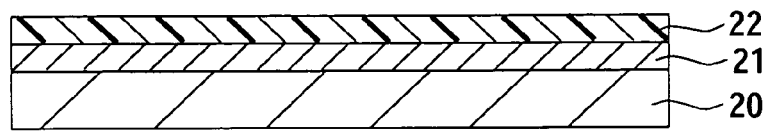
FIG. 17 is a sectional view of a step of an example of a production method of a semiconductor device according to the present embodiment.

When producing a semiconductor device, as shown in FIG. 17A, for example, a processing layer 21, such as polysilicon and silicon oxide, is formed on a processing substrate 20, and a resist film 22 made by an electron beam resist is formed on the processing layer 21.

Figure 17B:
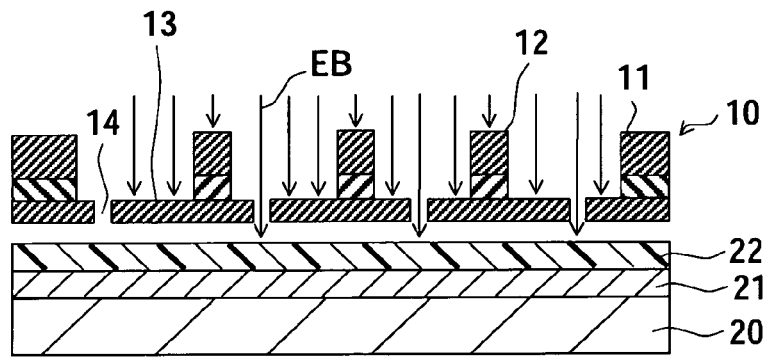

Next, the processing substrate 20 is set to the exposure apparatus shown in FIG. 1, and the mask 10 and the processing substrate 20 are aligned. An oblique detecting method is used for the alignment, and alignment marks formed respectively on the mask 10 and the processing substrate 20 are observed from the oblique direction for performing alignment. After the alignment, as shown in FIG. 17B, an exposure method according to the present embodiment explained above is performed. Consequently, exposure is performed on the resist film 22 on the processing substrate 20 by an electron beam EB passing through the pattern 14 formed on the membrane 13.

Figure 17C:
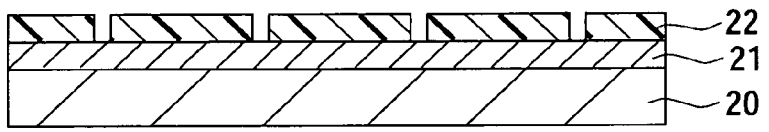

Next, as shown in FIG. 17C, due to development of the resist film 22, for example, when the resist film 22 is a positive type, electron beam irradiated portions are removed and a pattern is formed on the resist film 22.

Figure 17D:
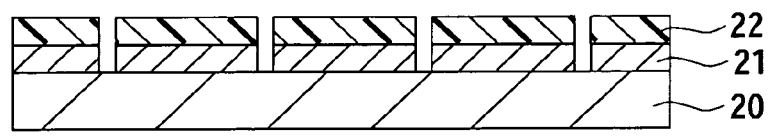

Next, as shown in FIG. 17D, by performing etching by using the resist film 22 as a mask, the processing layer 21 is subjected to pattern processing and a circuit pattern is formed. As the circuit pattern, there are, for example, a gate pattern and a contact hole pattern.

Figure 17E:
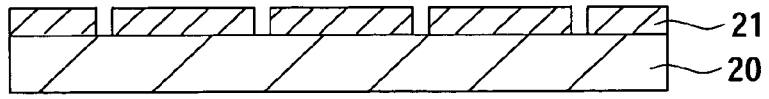

After that, as shown in FIG. 17E, the resist film 22 is removed and the pattern processing on the processing layer 21 is completed.

When producing a semiconductor device, by stacking still upper layers and repeating the steps shown in FIG. 17A to FIG. 17E explained above, an integrated circuit is formed.

A production method of a semiconductor device according to the present embodiment includes not only the case of using electron beam exposure for processing on all layers, but also the case of producing a semiconductor device by mix-and-match exposure, such as performing processing only on a critical layer, such as a gate, by using electron beam exposure and performing processing on other layers by using light exposure.

As explained above, in the mask according to the above explained present embodiment, a beam portion is composed of a first beam portion, wherein a plurality of first beams 12a extending by inclining with respect to the X-axis and Y-axis are arranged at regular intervals, and second beam portion, wherein a plurality of the second beams 12b extending by inclining with respect to the X-axis and Y-axis and intersecting with the first beams 12a are arranged at regular intervals; and the beam structure is regularly formed on the whole region surrounded by the supporting frame 11. Furthermore, four unit exposure regions 10A to 10D for performing exposure by being superimposed on the processing substrate 20 are set in the region surrounded by the supporting frame 11, and thin films of at least two unit exposure regions exist at any position when the four unit exposure regions 10A to 10D are superimposed.

As explained above, as a result that complementary exposure is made possible by the regular beam structure, it is possible to prevent strain of a pattern to be formed on the membrane 13 from becoming complicated. Therefore, strain can be easily corrected by forming a pattern 14 on the membrane 13 by correcting the position by considering the strain in advance or by correcting an irradiation position by deflecting an electron beam EB. Therefore, accuracy of transferring a pattern to the processing substrate can be improved.

Also, as shown in FIG. 12 or FIG. 13, complementary exposure cannot be applied to all die sizes by one beam arrangement, but complementary exposure can be applied when the die size is changed a little. In actual, the die size does not largely changed, so that it is sufficiently practicable.

Also, as explained with reference to FIG. 12 and FIG. 13, when a range of the die size to be used is determined in advance, it is sufficient if several kinds of mask blanks, wherein a size of the pattern arrangement region 13a of the membrane 13 is changed, are prepared. Therefore, by preparing mask blanks 100 on which beams are already processed, it is possible to attain a TAT reduction from pattern determination to mask production and a reduction of a mask cost.

As effects of making a size of one membrane 13 sectionalized by beams as small as 1 mm to 5 mm or so, other than improving mechanical strength of the mask, there is an effect of preventing thermal displacement of the pattern. Namely, when an electron beam is irradiated to the membrane 13, temperature of the membrane 13 rises, which results in displacement of the pattern formed on the membrane 13. A decay time of the membrane temperature is proportional to a square of a size of one membrane 13. Accordingly, by sectionalizing the membrane 13 by the beams 12, heat is rapidly transmitted to the beams 12 and a decay time of the membrane 13 temperature can be reduced. As a result, temperature rising of the membrane 13 can be suppressed and the pattern displacement can be prevented.

In the LEEPL technique, an oblique detecting method of irradiating an alignment light from the oblique direction with respect to the mask surface to the X-direction and Y-direction, and receiving a diffused light from alignment marks formed on the mask 10 and the processing substrate 20 to obtain an observation image is applied. In the mask according to the present embodiment, since the beams incline from the X-direction and Y-direction, the alignment light irradiated along the X-direction and Y-direction is not reflected to an alignment optical system. Therefore, the SN ratio of mark detection can be improved, and alignment accuracy can be improved.

Furthermore, when producing a mask, it is preferable that alignment marks are formed on the beams 12 in advance, and a pattern is drawn based on the alignment marks when drawing the pattern (refer to FIG. 16A). In this case, due to the regularly arranged beams, the alignment marks can be also arranged regularly, so that the pattern can be accurately formed on the mask.

According to an exposure method according to the present embodiment using the above mask, a pattern can be accurately transferred by performing exposure by using the above mask.

Also, by applying exposure using the above mask to a production method of a semiconductor device, a pattern layer can be accurately formed, and a highly reliable semiconductor device can be produced.

Second Embodiment

As shown in FIG. 12 and FIG. 13, a mask with beams 12 extending at an angle of ±45° with respect to the XY-coordinate system cannot be applied to square dies, such as those having a size of 26 (X-direction size)×26 (Y-direction size). In the present embodiment, an example of a mask having a beam arrangement capable of performing complementary exposure on a square die will be explained.

Figure 18:
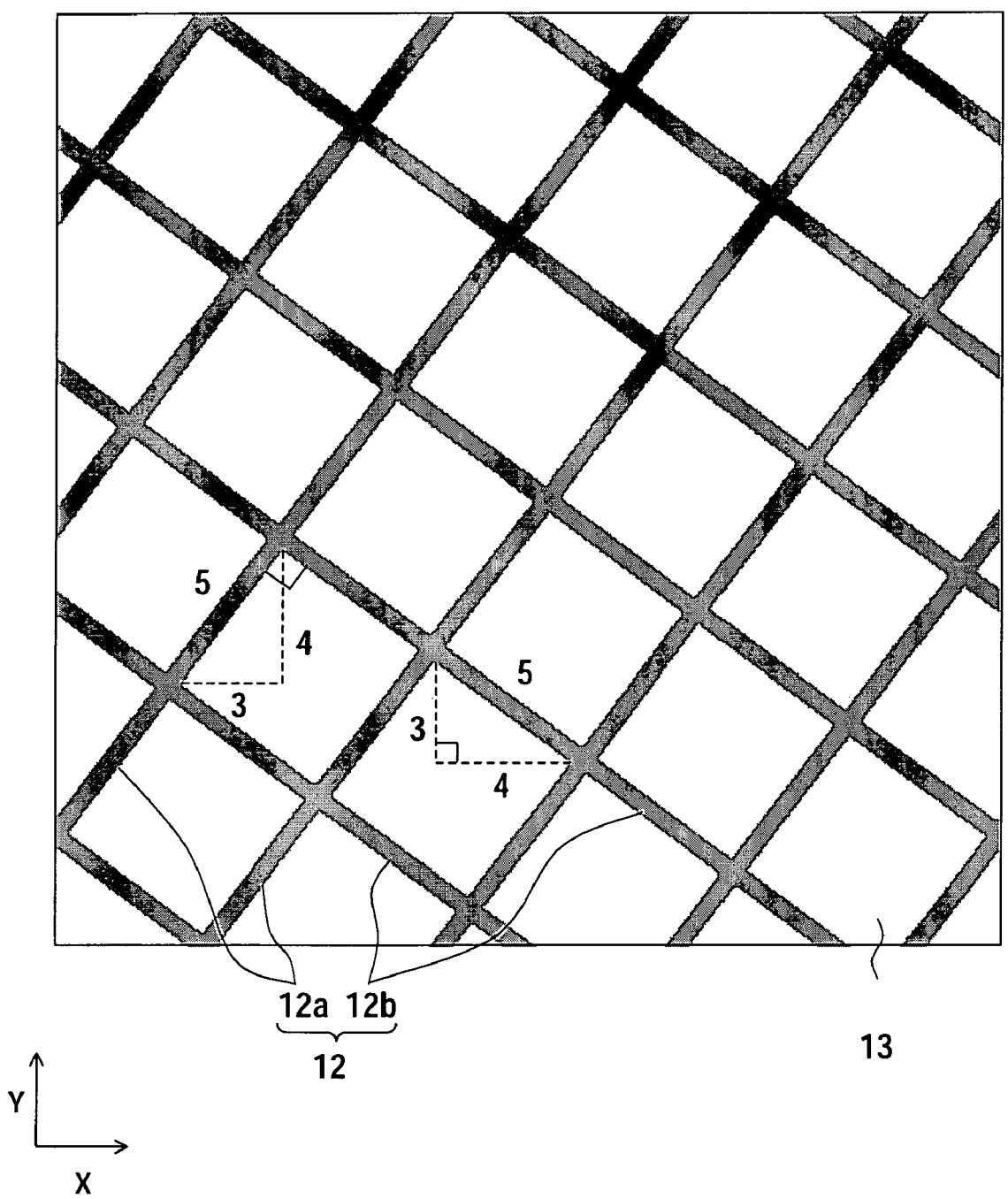
FIG. 18 is a view for explaining a beam arrangement of a mask according to a second embodiment.

FIG. 18 is a view for explaining a beam arrangement of a mask according to the present embodiment.

Also, in the present embodiment, the beams 12 are roughly divided to two based on the extending directions and composed of first beams 12a and second beams 12b. All of the plurality of beams 12 correspond to beams of the present invention.

In the present embodiment, the first beams 12a extend by the inclination of 4/3 with respect to the XY coordinate system.

A plurality of the first beams 12a are arranged at regular intervals. All of the plurality of first beams 12a correspond to a first beam portion of the present invention.

The second beams 12b extend by the inclination of −3/4 with respect to the XY-coordinate system and orthogonally intersect with the first beams 12a. A plurality of the second beams 12b are arranged at regular intervals. All of the second beams 12b correspond to a second beam of the present invention.

The above first beams 12a and second beams 12b sectionalize to a plurality of small regions, and square membranes 13 exist on the sectionalized regions. The membranes 13 are regions, on which a pattern can be arranged.

As explained above, first beams 12a and the second beams 12b are formed by being shifted a little from ±45° with respect to the XY-coordinate system. Here, the reason why the above inclination is adopted to the beams is because the inclination of the beams and distance between the beams form a right-angled triangle having a ratio of sides of 3:4:5 and a rounding error does not arise in a size of a processing unit region PUF to be set. This is because grid lines G sectionalizing the processing unit region PUF are set along the X-direction and Y-direction of the XY-coordinate system as shown in FIG. 6.

From the same viewpoint, the first beams 12a may extend by the inclination of 3/4 with respect to the XY-coordinate system and the second means 12b may extend by the inclination of −4/3 with respect to the XY-coordinate system. Note that a width of the beams and size of the membranes are the same as those in the first embodiment.

Figure 19:
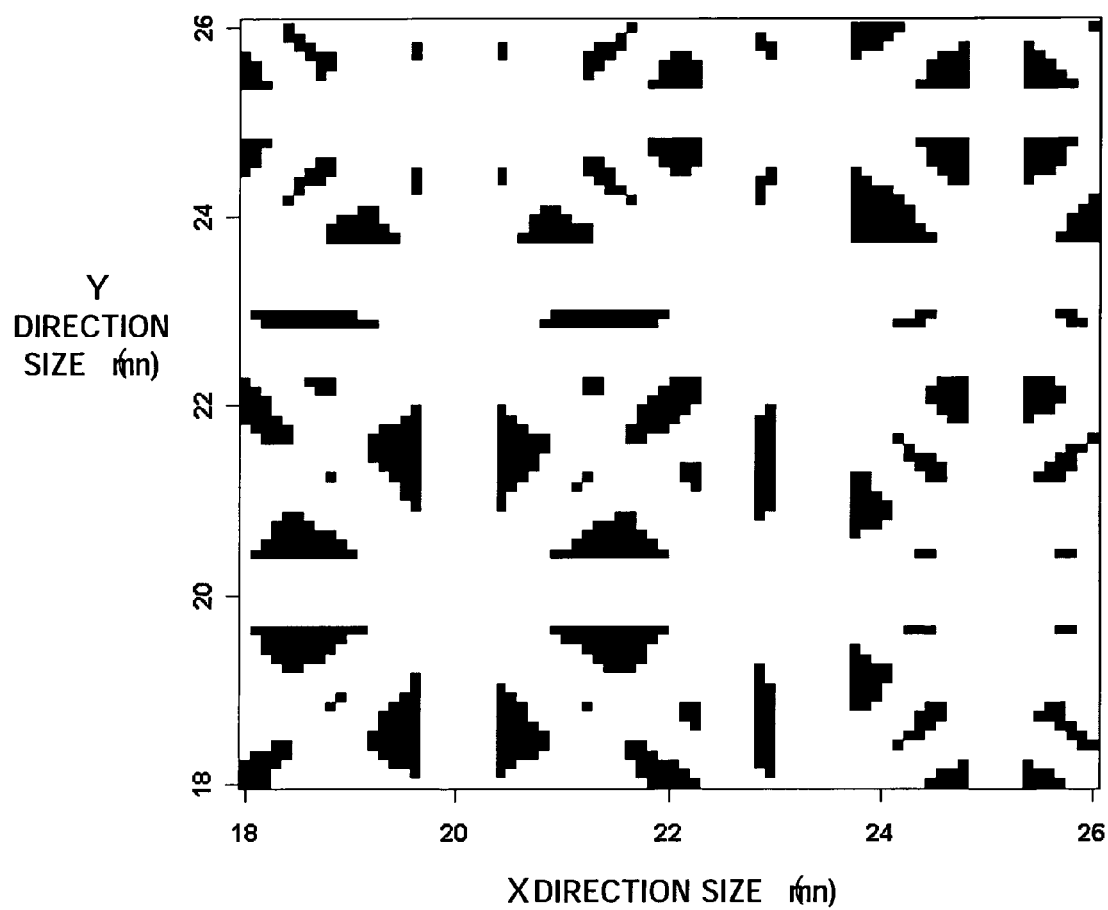
FIG. 19 is a view showing applicable die sizes to complementary exposure by a mask according to the second embodiment.

FIG. 19 is a view showing die sizes applicable to complementary exposure by a mask produced to have the same inclination of beams 12 as shown in FIG. 18 under the same condition as in FIG. 12 (a width of beams 12 including the margin regions 13b is 200 μm, and a pattern arrangement region 13a of the membranes 13 is 18 mm square).

Similarly, FIG. 19 shows that die sizes in the black region can be subjected to complementary exposure by the above mask. As shown in FIG. 19, applicable die sizes are less than those in the first embodiment, but complementary exposure with the above mask can be performed on square dies having sizes of 22×22, 24×24 and 26×26, which were not applicable in the first embodiment.

Figure 20:
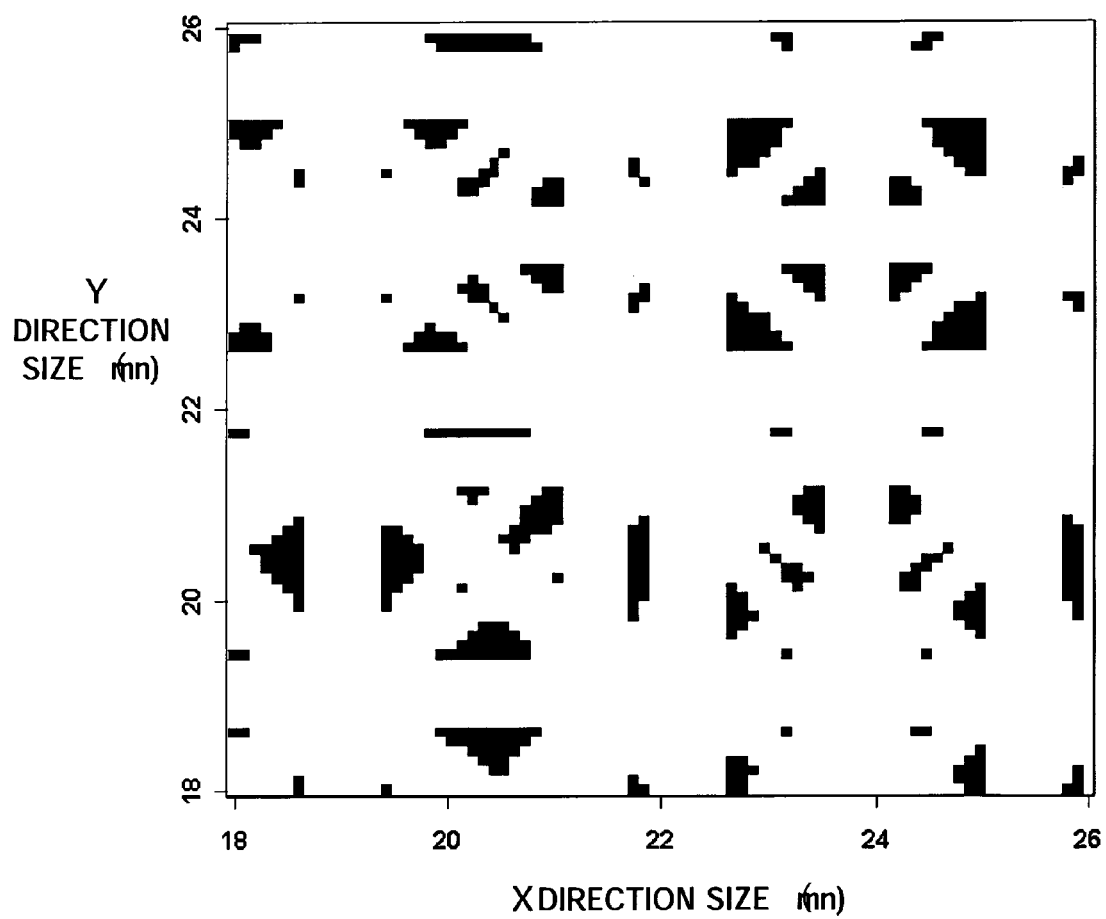
FIG. 20 is a view showing applicable die sizes to complementary exposure by a mask according to the second embodiment when a size of a pattern arrangement region of a membrane is changed.

FIG. 20 is a view showing die sizes applicable to complementary exposure on a mask produced in the same way as in FIG. 19 except that the pattern arrangement region 13a of the membranes 13 is changed to 1.75 mm.

Similarly, FIG. 20 shows die sizes on the black regions can be subjected to complementary exposure by the above mask. As shown in FIG. 20, complementary exposure with the above mask is possible on square dies having sizes of, for example, 21×21, 23×23 and 25×25, which were not possible by the mask produced under the condition in FIG. 19. Note that applicable die sizes are also less comparing with those in the first embodiment in this case.

As explained above, one kind of mask cannot be applied to all sizes of square dies, but by slightly changing a size of the pattern arrangement region 13a, applicable square die sizes can be changed.

The same effects as those in the first embodiment can be obtained by the mask according to the present embodiment, by the exposure method using the mask and by the production method of a semiconductor device using the exposure method.

The present invention is not limited to the above embodiments.

For example, in the present embodiment, an explanation was made on an example where the respective membranes 13 sectionalized by the beams 12 are square, but they may be rectangular-shaped. Also, an explanation was made on an example where the first beams 12a and second beams 12b are at right angles to each other in the present embodiment, but they do not have to be perpendicular to each other. Also, the configuration of the exposure apparatus explained in the present embodiment is just an example, and the configuration may be modified and it may be used for electron beam reduction projection exposure other than equal scale exposure. Also, an explanation was made on an example of exposure using an electron beam in the present embodiment, but an ion beam may be adopted as far as it is a charged particle beams. Also, an explanation was made on an example of producing a mask from a SOI substrate in the present embodiment, but there is not a limit to the mask production method. Materials and values mentioned in the present embodiment are just examples and they are not limited to those.

Other than the above, a variety of modification may be made within the scope of the present invention.

What is claimed is:

1. A mask comprising
a supporting frame,
a beam portion for sectionalizing a region surrounded by said supporting frame,
a thin film formed on the region sectionalized by said beam portion, and
apertures of a pattern formed on said thin film and obtained by complementarily dividing a circuit pattern to be transferred on an object to be exposed;
wherein said beam portion comprises
a first beam portion wherein a plurality of beams extending by inclining with respect to two coordinate axes composing a coordinate system for specifying a position of said pattern are arranged at regular intervals, and
a second beam portion wherein a plurality of beams extending by inclining with respect to said two coordinate axes and intersecting with said first beam portion are arranged at regular intervals;
wherein four unit exposure regions for performing exposure by being superimposed on said object to be exposed are set in the region surrounded by said supporting frame, and said thin film of at least two of said unit exposure regions exists at any position when superimposing said four unit exposure regions.

2. A mask as set forth in claim 1, wherein
said first beam portion is configured that a plurality of beams extending by inclining by approximately 45° with respect to said two coordinate axes are arranged at regular intervals, and
said second beam portion is configured that a plurality of beams extending by inclining by approximately 45° with respect to said two coordinate axes and perpendicularly intersecting with said first beam portion are arranged at regular intervals.

3. A mask as set forth in claim 1, wherein
said first beam portion is configured that a plurality of beams extending by the inclination of 4/3 in said coordinate system are arranged at regular intervals, and
said second beam portion is configured that a plurality of beams perpendicularly intersecting with said first beam portion are arranged at regular intervals.

4. A mask as set forth in claim 1, wherein
said first beam portion is configured that a plurality of beams extending by the inclination of 3/4 in said coordinate system are arranged at regular intervals, and
said second beam portion is configured that a plurality of beams perpendicularly intersecting with said first beam portion are arranged at regular intervals.

5. An exposure method using a mask comprising
a supporting frame,
a beam portion for sectionalizing a region surrounded by said supporting frame, a thin film formed on the region sectionalized by said beam portion, and
apertures of a pattern formed on said thin film and obtained by complementarily dividing a circuit pattern to be transferred on an object to be exposed;
wherein said beam portion comprises
a first beam portion wherein a plurality of beams extending by inclining with respect to two coordinate axes composing a coordinate system for specifying a position of said pattern are arranged at regular intervals, and
a second beam portion wherein a plurality of beams extending by inclining with respect to said two coordinate axes and intersecting with said first beam portion are arranged at regular intervals;
wherein four unit exposure regions for performing exposure by being superimposed on said object to be exposed are set in the region surrounded by said supporting frame, and said thin film of at least two of said unit exposure regions exists at any position when superimposing said four unit exposure regions;
for performing exposure by repeating
a charged particle beam irradiation step for irradiating a charged particle beam on said four unit exposure regions of said mask, and
a moving step for moving relative positions of said mask and said object to be exposed, and
superimposing said four unit exposure regions of said mask on said object to be exposed.

6. A production method of a semiconductor device for forming layers of a pattern by repeating a step of forming a processing film on a substrate, a step of forming a photosensitive film on said processing film, a step of performing exposure of a pattern of a mask on said photosensitive film, and a step of performing pattern processing on said processing film by performing etching on said processing film by using as an etching mask the photosensitive film subjected to pattern exposure,
using a mask comprising
a supporting frame,
a beam portion for sectionalizing a region surrounded by said supporting frame,
a thin film formed on the region sectionalized by said beam portion, and
apertures of a pattern formed on said thin film and obtained by complementarily dividing a circuit pattern to be transferred on an object to be exposed;
wherein said beam portion comprises
a first beam portion wherein a plurality of beams extending by inclining with respect to two coordinate axes composing a coordinate system for specifying a position of said pattern are arranged at regular intervals, and
a second beam portion wherein a plurality of beams extending by inclining with respect to said two coordinate axes and intersecting with said first beam portion are arranged at regular intervals;
wherein four unit exposure regions for performing exposure by being superimposed on said object to be exposed are set in the region surrounded by said supporting frame, and said thin film of at least two of said unit exposure regions exists at any position when superimposing said four unit exposure regions;
wherein in a step of performing exposure of a pattern of said mask on said photosensitive film,
exposure is performed by repeating
a charged particle beam irradiation step for irradiating a charged particle beam on said four unit exposure regions of said mask, and
a moving step for moving relative positions of said mask and said object to be exposed, and
superimposing said four unit exposure regions of said mask on said object to be exposed.

* * * * *